US006460458B2

(12) United States Patent
Verschueren

(10) Patent No.: US 6,460,458 B2
(45) Date of Patent: Oct. 8, 2002

(54) METHOD OF PLANOGRAPHIC PRINTING WITH A REUSABLE SUBSTRATE

(75) Inventor: Eric Petrus Verschueren, Merksplas (BE)

(73) Assignee: Agfa-Gevaert (BE)

( * ) Notice: Subject to any disclaimer, the term of this patent is extended or adjusted under 35 U.S.C. 154(b) by 0 days.

(21) Appl. No.: 09/736,824

(22) Filed: Dec. 14, 2000

(65) Prior Publication Data

US 2001/0013297 A1 Aug. 16, 2001

Related U.S. Application Data

(60) Provisional application No. 60/179,016, filed on Jan. 31, 2000.

(30) Foreign Application Priority Data

Jan. 18, 2000 (EP) ........................................... 00200176

(51) Int. Cl.$^{7}$ ............................ B41F 35/02; G03F 7/42

(52) U.S. Cl. ...................................... 101/478; 101/424

(58) Field of Search ................................ 101/453, 454, 101/456, 457, 462, 463.1, 465, 467, 478, 424, 425, 423

(56) References Cited

U.S. PATENT DOCUMENTS

| | | | | |
|---|---|---|---|---|
| 3,921,527 A | * | 11/1975 | Raschke et al. | 101/425 |
| 4,880,555 A | | 11/1989 | Walls et al. | 101/424 |
| 5,203,926 A | | 4/1993 | Bondurant | 134/42 |
| 5,291,827 A | * | 3/1994 | Liers et al. | 101/425 |
| 5,925,496 A | * | 7/1999 | Ghosh et al. | 101/453 |
| 6,237,493 B1 | * | 5/2001 | Suda et al. | 101/463.1 |
| 6,298,780 B1 | * | 10/2001 | Ben-Horin et al. | 101/457 |

FOREIGN PATENT DOCUMENTS

| | | |
|---|---|---|
| EP | 0081355 | 6/1983 |
| EP | 0770495 | 5/1997 |
| EP | 0802457 | 10/1997 |
| JP | 61219044 | 9/1986 |

* cited by examiner

*Primary Examiner*—Stephen R. Funk
(74) *Attorney, Agent, or Firm*—Leydig, Voit & Mayer, Ltd.

(57) ABSTRACT

A direct-to-plate method of lithographic printing is disclosed which enables to recycle the lithographic substrate of the printing master. The method comprises the steps of (a) making a negative-working imaging material by coating on a hydrophilic substrate a coating solution comprising hydrophobic thermoplastic polymer particles and a hydrophilic binder;
(b) making a printing master having ink-accepting areas by image-wise exposing the imaging material;
(c) applying ink and fountain solution to the printing master;
(d) removing the ink-accepting areas from the printing master by supplying an alcohol and preferably also an alkanolamine.

The above steps are preferably carried out on-press.

10 Claims, No Drawings

METHOD OF PLANOGRAPHIC PRINTING WITH A REUSABLE SUBSTRATE

This application claims the benefit of U.S. Provisional Patent Application No. 60/179,016, filed Jan. 31, 2000, which is incorporated herein by reference.

FIELD OF THE INVENTION

The present invention relates to a cleaning method for recycling the lithographic substrate of a printing master.

BACKGROUND OF THE INVENTION

In conventional lithographic printing, ink and an aqueous fountain solution are supplied to the surface of a printing master which contains ink-accepting (oleophilic) and water-accepting (hydrophilic) areas. The inked image pattern is then transferred from the surface of the master to a blanket cylinder having a compressible surface. From the blanket cylinder the image is impressed onto paper. The master is typically a printing plate which carries an image on a dimensionally stable substrate such as an aluminium sheet. The imaged aluminium plate is secured to the plate cylinder of a printing press by a mechanical lock-up mechanism which defines positional registration between the plate and the surface of the cylinder. After the end of the press-run, the mechanical lock-up system is released so that the printing plate carrying the printed image can be removed and discarded and another printing plate can be positioned and locked into place. A new print job can then be started.

Printing masters are generally obtained by the so-called computer-to-film method wherein each colour selection is transferred to graphic arts film using an image-setter. After processing, the film can be used as a mask for the exposure of an imaging material called plate precursor and after plate processing, a printing plate is obtained which can be used as a master. These steps are usually performed in dedicated exposure and processing equipment and the printing plates are then transported to the printing press and attached to the printing cylinder by press operators using a lock-up mechanism built into the cylinder itself. Although the attachment of the printing cylinder is generally a manual operation, robotic means have been developed for positioning and securing the printing plates.

In recent years the so-called computer-to-plate method has gained a lot of interest. This method, also called direct-to-plate method, bypasses the creation of film because the digital data are transferred directly to a plate precursor by means of a so-called plate-setter. On-press imaging is a direct-to-plate method (also called direct-to-press), wherein the image is exposed on the plate while said plate is mounted on the plate cylinder of a printing press. The major advantage of the latter method compared to off-press plate-making is the improved registration between printing stations of a multi-colour printing press.

Two types of such on-press imaging methods are known. According to a first type, a printing plate precursor is mounted on a printing press, image-wise exposed, optionally developed, and then used as a printing master and finally removed from the press and disposed of, thus requiring a new plate material for each image. An example of this technology is the well-known Heidelberg Model GTO-DI, manufactured by Heidelberg Druckmaschinen AG (Germany) which is described in detail in U.S. Pat. No. 5,339,737. A drawback of this method is the need to use a new plate for each press-run, thus increasing the cost of the printing process.

In a second type of on-press imaging systems, the same lithographic substrate is used in a plurality of press-runs (hereinafter called printing cycles). In each printing cycle, a heat-sensitive or photosensitive layer is coated on the lithographic substrate to make a printing plate precursor and after image-wise exposure and optional development a printing master is obtained. After the press-run, the ink-accepting areas of the printing master are removed from the lithographic substrate in a cleaning step so that the substrate is recycled and can be used in a next cycle of coating, exposing and printing without the need to mount a new plate on the cylinder. Examples of such on-press coating and on-press imaging systems are described in e.g. U.S. Pat. No. 5,188,033; U.S. Pat. No. 5,713,287; EP-A 786 337 and EP-A 802 457. The latter patent application describes an apparatus comprising a printing member, means for applying a uniform coating, means for scan-wise exposing said uniform coating in accordance with an image pattern and means for developing said uniform coating to leave an image on said printing member, the image consisting of ink-accepting areas on an ink-repellent background or ink-repellent areas on an ink-accepting background. According to a preferred embodiment, the coating comprises hydrophobic thermoplastic polymer particles in a hydrophilic binder.

In the known on-press coating methods, the cleaning of the lithographic substrate often fails because no suitable compromise can be found between the chemical reactivity of the cleaning liquid versus the ink-accepting areas which have to be removed on the one hand and the required inertness of said cleaning liquid versus the fragile lithographic surface on the other hand. A typical lithographic surface is mechanically as well as chemically quite vulnerable. A lithographic surface consists generally of a micro-pore structure in order to differentiate the spreading properties of the ink and the fountain. Anodised aluminium plates comprise a lithographic surface containing one or more metal oxides on which absorption phenomena can take place. These metal oxides are very susceptible to chemical conversion into forms which are no longer lithographically active.

The above mentioned micro-porosity of a lithographic surface is also highly susceptible to mechanical damage. The presence of solid particles in cleaning liquids, which is often required for efficient mechanical cleaning of the lithographic surface, results inevitably in a disturbance of the micro-structure of said surface. Because ink and the coated imaging layer penetrate in the micro-pore structure, it is necessary to carry out a vigorous cleaning so as to avoid phantom images in the subsequent printing cycle, which are due to an insufficient removal of the previous image.

In addition, the known cleaning liquids typically contain solvents which are harmful to hoses, pumps and sealings and/or require a very thorough rinsing with water because these liquids are not compatible with the coating step in the next printing cycle.

SUMMARY OF THE INVENTION

It is an object of the present invention to provide a lithographic printing method comprising a cleaning step whereby the ink-accepting areas of a printing master can be removed effectively so that the substrate can be reused in a next print cycle. More particularly, a cleaning step is required which is characterised by a low risk of deteriorating the lithographic surface of the substrate. It is also an object of the present invention to provide a printing method wherein a cleaning liquid is used which does not affect the hardware of the printing press or the cleaning apparatus, in particular a liquid which is inert towards rubber, and which does not require a long rinsing step after the cleaning.

The above objects are obtained by the method of claim 1. The cleaning liquid defined in claim 1 effectively removes the ink-accepting areas of the printing master defined in claim 1. No ghost images are observed after several (>10) print cycles of coating, exposure, printing and cleaning. Rubber hoses and seals are not affected by the cleaning liquid and low amounts of water suffice in the optional rinsing step.

Further objects of the present invention will become clear from the description hereinafter.

Preferred embodiments of the method of the present invention are defined in the dependent claims.

DETAILED DESCRIPTION OF THE INVENTION

The cleaning liquid used in the method of the present invention contains an alcohol. Suitable examples of the alcohol are: 2-butoxyethanol, propanol, 2-(propyloxy) ethanol, fenoxyethanol, benzylalcohol, butoxypropanol, ethoxypropanol, 1-isobutoxy-2-propanol, 1-isomethoxy-2-propanol, 1-propoxy-2-propanol, diacetone alcohol, tetrahydrofurfuryl alcohol, cathechol, trimethylolpropane, ethanediol, propanediol, and butanediol. 2-butoxyethanol and benzylalcohol are highly preferred. The alcohol can be a liquid alcohol which can be supplied to the printing master as an essentially pure liquid. More preferably, the cleaning liquid is an aqueous solution comprising an alcohol in an amount between 1% and 20% by weight, more preferably between 2% to 10% by weight and most preferably between 2% and 5% by weight.

In a preferred embodiment, the cleaning liquid also contains an alkanolamine in a concentration of at most 20% by weight. Suitable examples of the alkanolamine are: diethanolamine, diethylethanolamine, diisopropylamine, ethylamine, ethylene-diamine, isopropylamine, monoethanolamine, monoisopropylamine, morpholine, triethanolamine, triethylenetetramine, triisopropanolamine, aminoethoxyethanol, aminoethylaminoethanol, monopropanomamine, methylaminoethanol, hydroxylamine, N-butyl-ethanolamine, N-ethyldiethanolamine, diglycolamine, and dimethylglyoxime. Mono-ethanolamine is highly preferred.

The cleaning liquid preferably also comprises a surfactant in an amount between 0.001% and 5% by weight.

The above cleaning liquids are very suitable for removing the ink-accepting areas from a printing master which is obtained by coating a hydrophilic substrate with a coating solution containing hydrophobic thermoplastic polymer particles and a hydrophilic binder. The imaging material thus obtained is negative-working, i.e. hydrophobic areas are formed upon exposure. These areas define the printing areas of the master. It is believed that the applied heat induces a coagulation of the hydrophobic polymer particles, thereby forming a hydrophobic phase, whereas the hydrophobic polymer particles remain unchanged in the non-heated areas. Coagulation may result from heat-induced softening or melting of the thermoplastic polymer particles.

The cleaning liquids of the present invention are capable of removing the ink remaining on the printing areas as well as the hydrophobic phase itself which gives rise to the ink-accepting properties of the printing areas. In a preferred embodiment, the method of the present invention comprises two cleaning steps: first, an alcohol is supplied to the master so as to remove the ink and subsequently, an alkanolamine is used to remove the hydrophobic areas. Besides the alcohol and the alkanolamine, other solvents such as an amide, e.g. dimethylformamide or 2-N-methylpyrrolidone, can be supplied to the master, either as a mixture with the alcohol or alkanolamine, or in a separate cleaning step.

The imaging material used in the present invention preferably contains hydrophobic thermoplastic polymer particles having an average particle size between 40 nm and 2000 nm, and more preferably between 40 nm to 200 nm, so as to improve sensitivity and throughput and to avoid scumming. Furthermore the polymer particles preferably have a coagulation temperature above 50° C. and more preferably above 70° C. There is no specific upper limit to the coagulation temperature of the polymer particles, however the temperature should be sufficiently below the decomposition temperature of the polymer particles. Preferably the coagulation temperature is at least 10° C. below the temperature at which the decomposition of the polymer particles occurs.

Preferred examples of thermoplastic hydrophobic polymer particles for use the present invention have a Tg above 80° C. The weight average molecular weight of the polymers may range from 5,000 to 5,000,000 g/mol. Preferably the polymer particles are selected from the group consisting of polyvinyl chloride, polyvinylidene chloride, polyesters, polyurethanes, polyacrylonitrile, polyvinyl carbazole etc., and copolymers or mixtures thereof. The most preferred examples are polystyrene and polymethylmethacrylate or copolymers thereof.

The polymer particles are present as a dispersion in the coating solution and may be prepared by the methods disclosed in U.S. Pat. No. 3,476,937. Another method especially suitable for preparing an aqueous dispersion of the thermoplastic polymer particles comprises:

dissolving the hydrophobic thermoplastic polymer in an organic solvent which does not mix with water, dispersing the thus obtained solution in water or in an aqueous medium and removing the organic solvent by evaporation.

Suitable hydrophilic binders for use in the present invention are preferably water-soluble (co)polymers for example synthetic homo- or copolymers such as polyvinylalcohol, a poly(meth)acrylic acid, a poly(meth)acrylamide, a polyhydroxyethyl(meth)acrylate, a polyvinylmethylether or natural binders such as gelatin, a polysaccharide such as e.g. dextran, pullulan, cellulose, arabic gum, alginic acid, inuline or chemically modified inuline.

The coating solution preferably contains surfactants which can be anionic, cationic, non-ionic or amphoteric. Perfluoro surfactants are preferred. Particularly preferred are non-ionic perfluoro surfactants. Said surfactants can be used alone or preferably in combination.

The coverage of the coated layer ranges preferably from 0.3 to 20 $g/m^2$, more preferably from 0.5 to 5 $g/m^2$. The amount of hydrophobic thermoplastic polymer particles contained in the coated layer is preferably between 2 and 40% by weight and more preferably between 10 and 20% by weight of the total weight of said layer.

The above coating solution can be sprayed or jetted onto the substrate, but other known coating techniques are also possible.

The substrate used in the present invention can be a plastic support or a ceramic but is preferably a metal such as aluminium. The substrate has a hydrophilic surface and is preferably characterised by a roughness value of at least 0.2 $\mu$m, more preferably of at least 0.3 $\mu$m, e.g. electrochemically and/or mechanically grained and anodised aluminium. The substrate can be a sheet-like material such as a plate but, alternatively, the coating solution may be applied directly to the plate cylinder of a rotary printing press, said cylinder thereby acting as the substrate. The lithographic substrate can also be a seamless sleeve printing plate, obtained by e.g. soldering a plate into a cylindrical form by means of a laser. The sleeve then can be slid around the plate cylinder instead of mounting a conventional printing plate. More details on sleeves are given in "Grafisch Nieuws" , 15, 1995, page 4 to 6.

The exposure of the imaging material obtained by coating the above coating solution on the lithographic substrate can be carried out by means of direct thermal recording using e.g. a thermal head, or by irradiation with high intensity light. In the latter embodiment, the heat-sensitive material preferably comprises a compound capable of converting light into heat, preferably a compound having sufficient absorption in the wavelength range of the light source used for image-wise exposure. Particularly useful compounds are for example dyes and in particular infrared dyes as disclosed in EP-A 908 307 and pigments and in particular infrared pigments such as carbon black, metal carbides, borides, nitrides, carbonitrides, bronze-structured oxides and oxides structurally related to the bronze family but lacking the A component e.g. $WO_{2.9}$. It is also possible to use conductive polymer dispersions such as polypyrrole or polyaniline-based conductive polymer dispersions. The lithographic performance and in particular the print endurance obtained depends i.a. on the heat-sensitivity of the imaging material. In this respect it has been found that carbon black yields very good and favourable results.

Image-wise exposure in the method of the present invention is preferably an image-wise scanning exposure involving the use of a laser or L.E.D. Preferably used are lasers that operate in the infrared or near-infrared, i.e. wavelength range of 700–1500 nm. Most preferred are laser diodes emitting in the near-infrared.

The printing cycle of the present invention will be further described hereinafter according to a preferred embodiment. First, a grained and anodised aluminium plate is mounted on the plate cylinder of a rotary printing press. Then, the coating solution described above is sprayed on the hydrophilic lithographic surface of the plate, so as to form a continuous imaging layer. Preferred values of the spraying parameters have been defined in EP-A no. 99203064 and EP-A no. 99203065, both filed on Sep. 15, 1999. The imaging layer is then image-wise exposed whereby the exposed areas are converted to hydrophobic ink-accepting areas while the unexposed areas remain hydrophilic. The hydrophobic areas define the printing areas of the master. Subsequently, printing is started by applying ink and a fountain solution to the printing master. In order to dissolve and remove the non-exposed areas of the coated layer effectively, only fountain solution is preferably supplied during a few revolutions of the press (about 10), and then also ink is fed to the plate. After the press-run, the lithographic substrate is recycled by treatment with a cleaning liquid as described above. Finally, the substrate can be rinsed and dried and then, a new printing cycle can be started by spraying the coating solution to the recycled substrate.

The cleaning step can be executed in a cleaning unit similar to the known blanket cleaning system. According to that embodiment, a cloth is moistened with the cleaning liquid, contacted with the printed plate during 1 to 50, more preferably during 2 to 10 revolutions with a contacting pressure between 0.1 and 5 Pa at a rotation speed in the range of 2 to 50 m/min. Afterwards the contact between the printing surface and the cleaning cloth is disrupted and the cloth is transported until a dry and clean part of the cloth is available.

The cleaner can also be applied by spraying, coating or jetting the cleaning liquid on the lithographic substrate or on the cloth. The removal of the ink-accepting areas can also be effected with another absorbing medium than a cloth. Cleaning can also be effected by combining the treatment with the cleaning liquid of the present invention with other means of mechanical rubbing such as a rotating brush or by jetting water or a volatile medium such as air, a solvent or dry ice pellets. Also vacuum extraction can be used during the cleaning treatment.

The cleaning step is preferably followed by a rinsing step, wherein water is sprayed onto the substrate. The plate can then be dried with a cloth, e.g. using the same blanket cleaning system described above. Preferably the rinsing step involves only a slight moistening of the lithographic surface, i.e. not more than 50 ml/m$^2$ of water is supplied to the plate. The rinsing step may be repeated several times, preferably between 2 to 5 times.

All the steps of the method of the present invention are preferably performed on-press. Alternatively, the lithographic substrate can also be mounted on a drum in a dedicated coating apparatus (off-press coating) and subsequently be mounted on a plate setter for image-wise exposure (off-press exposure). Then, the printing master thus obtained can be mounted on a press cylinder and printing is started by supplying ink and a fountain solution. After the press-run, the plate can be cleaned as described above, either on-press or in a dedicated cleaning apparatus, and the recycled substrate can then be used again in a next printing cycle.

EXAMPLES

The following examples illustrate the present invention without limiting it thereto. All parts and percentages are by weight unless otherwise specified.

Example 1

Preparation of the Lithographic Substrate

A 0.30 mm thick aluminium foil was degreased by immersing the foil in an aqueous solution containing 5 g/l of sodium hydroxide at 50° C. and rinsed with demineralised water. The foil was then electrochemically grained using an alternating current in an aqueous solution containing 4 g/l of hydrochloric acid, 4 g/l of hydroboric acid and 5 g/l of aluminium ions at a temperature of 35° C. and a current density of 1200 A/m$^2$ to form a surface topography with an average center-line roughness Ra of 0.5 m$\mu$.

After rinsing with demineralised water, the aluminium foil was etched with an aqueous solution containing 300 g/l of sulphuric acid at 60° C. for 180 seconds and rinsed with demineralised water at 25° C. for 30 seconds.

The foil was subsequently subjected to anodic oxidation in an aqueous solution containing 200 g/l of sulphuric acid at a temperature of 45° C., a voltage of about 10 V and a current density of 150 A/m$^2$ during about 300 seconds to form an anodic oxidation film of 3.0 g/m$^2$ of $Al_2O_3$, then washed with demineralised water and post-treated with a solution containing polyvinylphosphonic acid and subsequently with a solution containing aluminium trichloride, rinsed with demineralised water at 20° C. during 120 seconds and dried.

Preparation of the Coating Solution

A 2.6% solution in water was prepared by mixing polystyrene latex, dye I and a hydrophilic binder. After spraying and drying, the resulting layer contained 75% of the polystyrene latex, 10% of the dye I and 15% of GLASCOL E 15™. GLASCOL E 15™ is a polyacrylic acid, commercially available at N.V. Allied Colloids Belgium.

The structure of Dye I is as follows:

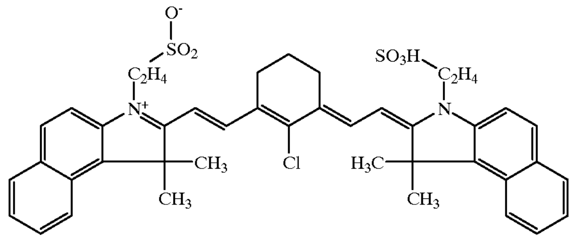

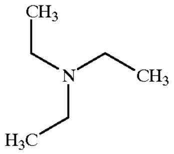

Preparation of the Imaging Material

The above aluminium substrate was mounted on a drum, rotating at a line speed of 164 m/min. The above solution was coated on the substrate by means of an air-assisted spray nozzle, type SUJ1, available from Spraying Systems Belgium (Brussels). The spray nozzle was mounted at a distance of 80 mm from the substrate and the flow rate of the spray solution was set at 7 ml/min. During spraying, the nozzle was moved at a speed of 1.5 m/min and an air pressure of $7.58\times10^5$ Pa was used on the spray head. The coated layer was dried by applying hot air (70° C.).

Printing Step

The imaging material was exposed in a CREO 3244™ external drum plate setter at 2400 dpi and 150 rpm with a power setting of 15.5 Watt. The imaged plates was printed on a GTO 46 printing press with K+E 800 Skinnex ink and as fountain solution Rotamatic to a run length of 5000. The printing quality was excellent.

Recycling of the Lithographic Substrate

The plate was mounted on a drum of a cleaning unit comparable to a typical blanket cleaning system. A cloth was moistened with an aqueous cleaning liquid comprising 2.5% of 2-butoxyethanol. The cleaning was carried out by contacting the cloth with the printing plate at a pressure of 0.67 Pa during 5 revolutions of the drum. The cloth was rotating relative to the plate at a speed of 20 m/min. Then, 30 ml/m$^2$ of water was sprayed on the printing plate as a rinsing liquid, followed by contacting the moistened plate with a dry and clean part of the cloth (same settings as in the cleaning step, 1 revolution). The rinsing step was repeated another 4 times.

Example 2

The same procedure as in example 1 was repeated but the cleaning liquid contained 2.5% of 2-butoxyethanol and 3% of ethanolamine.

Example 3

The same procedure as in example 1 was repeated but two cleaning steps were performed: in a first step, an aqueous solution of 2.5% of 2-butoxyethanol was supplied and in a second step, an aqueous solution of 3% of ethanolamine was used. A single rinsing step was sufficient.

Results

The above sequence of spraying, imaging, printing, cleaning, rinsing and drying was repeated 10 times for each of the three cleaning liquids defined above. After each cycle, the plate cleanliness, coating quality and printing quality (staining, presence of ghost images) were evaluated visually. Each of the above cleaning liquids produced excellent results for all those criteria.

The above cleaning liquids were tested on chemical reactivity towards rubber of the type EPDM (a terpolymer of ethylene, propylene and a non-conjugated diene), which is frequently used in blanket cleaning systems. After immersing the rubber in the cleaning liquid during 24 hours, the weight increase of the rubber (due to swelling) was measured. The cleaning liquids used in Examples 1, 2 and 3 caused a weight increase of at most 0.12%, which is regarded acceptable.

I claim:

1. A direct-to-plate method of lithographic printing with a reusable substrate having a hydrophilic surface, the method including the steps of (a) making a negative-working imaging material by coating on the hydrophilic surface a coating solution comprising hydrophobic thermoplastic polymer particles and a hydrophilic binder;

(b) making a printing master having ink-accepting areas by image-wise exposing the imaging material;

(c) applying ink and fountain solution to the printing master; and (d) removing all the ink-accepting areas from the printing master by applying a cleaning liquid comprising an alcohol and an alkanolamine to the printing master.

2. A method according to claim 1 wherein the cleaning liquid is an aqueous solution comprising between 1% and 20% by weight of the alcohol and at most 20% by weight of the alkanolamine.

3. A method according to claim 1 further comprising a step (e) wherein the substrate is rinsed with water.

4. A method according to claim 3 wherein water is supplied to the substrate during step (e) in an amount not higher than 50 ml/m$^2$.

5. A method according to claim 1 wherein during step (d) the printing master is rubbed by a cloth or a rotating brush or by jetting water or a volatile medium.

6. A method according to claim 1 wherein the alcohol is benzylalcohol or 2-butoxyethanol.

7. A method according to claim 1 wherein the alkanolamine is ethanolamine.

8. A method according to claim 1 wherein the substrate is a plate cylinder of a rotary printing press or a plate or sleeve mounted on a plate cylinder of a rotary printing press.

9. A method according to claim 1 wherein the coating solution or the cleaning liquid is sprayed or jetted onto the substrate.

10. A direct-to-plate method of lithographic printing with a reusable substrate having a hydrophilic surface, the method including the steps of (a) making a negative-working imaging material by coating on the hydrophilic surface a coating solution comprising hydrophobic thermoplastic polymer particles and a hydrophilic binder;

(b) making a printing master having ink-accepting areas by image-wise exposing the imaging material;

(c) applying ink and fountain solution to the printing master; and (d) removing the ink-accepting areas from the printing master by first applying alcohol to the printing master followed by an alkanolamine.

* * * * *